(12) United States Patent
Dobashi et al.

(10) Patent No.: US 6,344,780 B1
(45) Date of Patent: Feb. 5, 2002

(54) IMPEDANCE ADJUSTING CIRCUIT

(75) Inventors: Noriaki Dobashi; Zdzislaw Czarnul, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/397,012

(22) Filed: Sep. 15, 1999

(30) Foreign Application Priority Data

Sep. 18, 1998 (JP) .......................................... 10-265364

(51) Int. Cl.[7] .................................................. H03H 7/40
(52) U.S. Cl. ........................................ 333/17.3; 333/32
(58) Field of Search .......................... 333/32, 262, 17.3

(56) References Cited

U.S. PATENT DOCUMENTS 5,654,679 A * 8/1997 Mavretic et al. ............ 333/17.3

* cited by examiner

*Primary Examiner*—Robert Pascal
*Assistant Examiner*—Stephen E. Jones
(74) *Attorney, Agent, or Firm*—Oblon, Spivak, McClelland, Maier & Neustadt, P.C.

(57) ABSTRACT

An impedance adjusting circuit for setting accurate impedance ratio has a plurality of paths each having impedance adjusting section which is a serially connected switch element and impedance element. A synthesized impedance of an ON resistance of the switch element and impedance of the impedance element in each impedance adjusting section is set to have a predetermined proportional relation. This enables accurate trimming without generating peak level variation of frequency characteristic when applied to a filter.

7 Claims, 7 Drawing Sheets

IMPEDANCE ADJUSTING CIRCUIT

BACKGROUND OF THE INVENTION

This invention relates to an impedance adjusting circuit for adjusting impedance in a circuit and more particularly to a circuit preferably used in a trimming circuit for frequency adjustment of an active filter, to improve accuracy in A/D, D/A converters, etc.

An active filter is a circuit performing filtering which has an active element as a main part. Such active filter is generally composed of an operational amplifier, resistors and capacitors. Its frequency characteristics is determined by values of the resistors and the capacitors.

However, the values of the resistors and the capacitors tend to be varied due to variations of width, thickness and impurity concentration, which may vary in manufacturing process therefor.

From a point of view that there are variations in values of elements, in order to compensate frequency offset of an active filter, resistance and/or capacitance is trimmed. This trimming is conventionally performed by switching over a set of switches to select paths for adjustment, which results in fine adjustment of elements.

Figure 1:
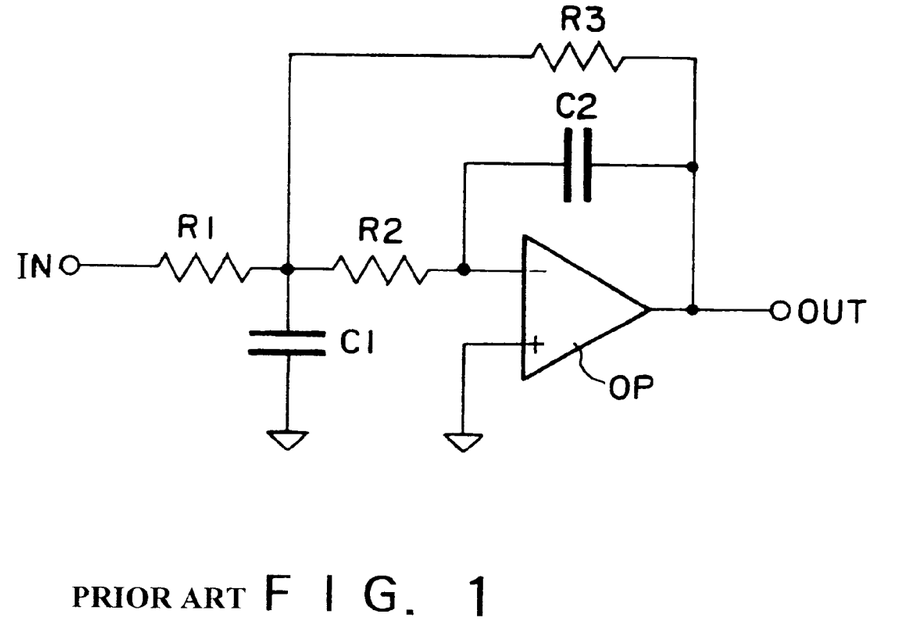
FIG. 1 is a circuit diagram showing construction of a typical active filter to which the present invention is applied.

FIG. 1 is a circuit diagram of a typical active filter, which is a double feedback low pass filter.

In this circuit, series-connected resistors R1 and R2 are provided between an input terminal IN of this filter and a reverse input terminal of an operational amplifier OP, there is also provided a capacitor C1 between a ground and a common node of the resistors R1 and R2. Furthermore, a capacitor C2 is connected between an output terminal OUT of the operational amplifier OP and the reverse input terminal thereof, and a resistor R3 is connected between the output terminal OUT and the common node of the resistors R1 and R2.

A cut-off frequency characteristic fc in this active filter is given as $$fc = \frac{1}{2\pi\sqrt{R2 \cdot R3 \cdot C1 \cdot C2}}$$

From this equation, it is understood that the frequency characteristic is adjusted by changing at least one of the resistors and/or the capacitors.

Next, an actual trimming method explained.

Figure 2:
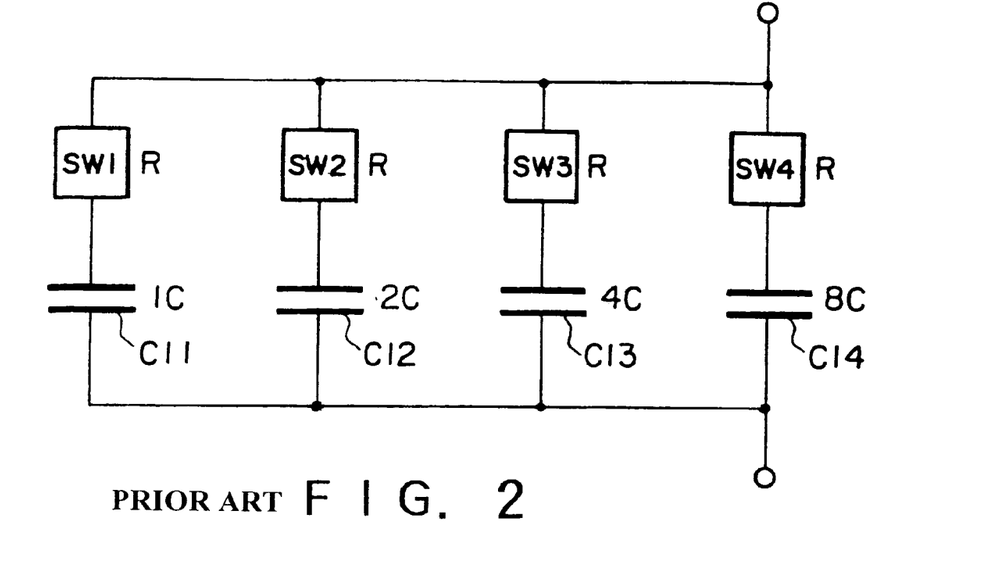
FIG. 2 is a circuit diagram showing a conventional impedance adjusting circuit.

FIG. 2 is a circuit diagram of an adjusting circuit (trimming circuit) for adjusting a capacitor, for example, appeared in FIG. 1. In this figure, capacitors C11, C12, C13 and C14 having capacitance of 1C, 2C, 4C and 8C (C is a reference capacitance value) are respectively series-connected with corresponding switches SW1, SW2, SW3 and SW4 and these four sets of series-connected capacitor and switch are connected in parallel. By combining ON states of switches SW1–SW4, capacitance can be adjusted in a range of 1C–15C by 1C step.

However, since this adjusting circuit uses a plurality of switches SW1–SW4 of the same size, and as a result they have the same ON state resistance R, synthesized impedance of the ON resistance and capacitance are not in proportion to paths selected, and therefore there remains effect of jω component.

Figure 3:
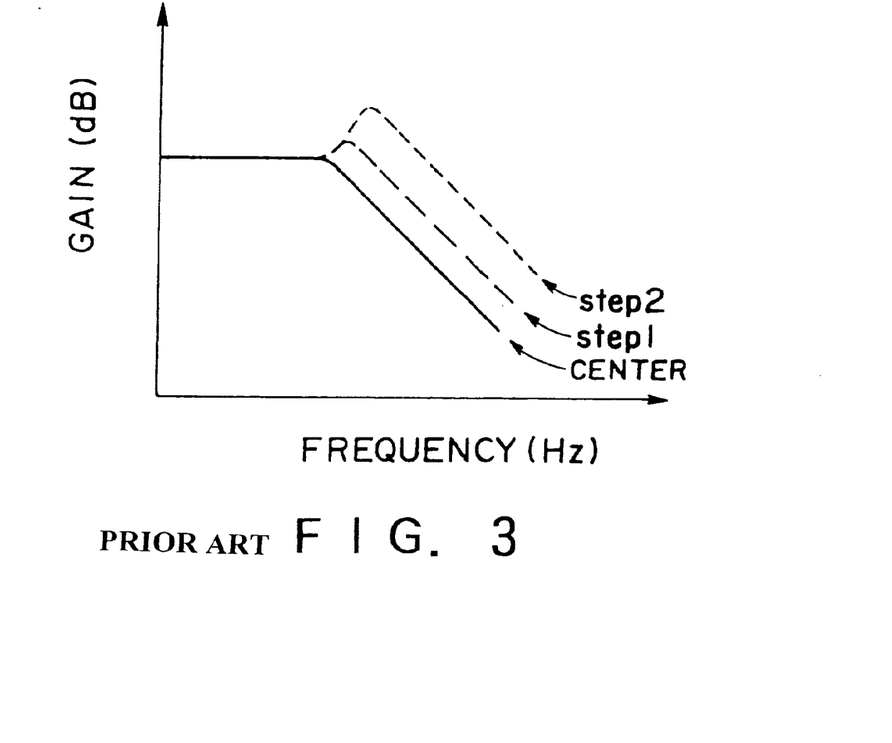
FIG. 3 is a graph showing a problem when frequency characteristic of a filter is adjusted using the circuit shown in FIG. 2.

As a result, as shown in FIG. 3, frequency can be changed by trimming step by step, but there is a problem that the peak level around cut-off frequency also changes.

SUMMARY OF THE INVENTION

It is therefore an object of the invention to provide an impedance adjusting circuit which sets accurate impedance ratio.

It is another object of the invention to provide an impedance adjusting circuit which performs accurate trimming without generating any peak level change when applied to a filter circuit.

According to one aspect of the present invention, there is provided an impedance adjusting circuit an impedance adjusting circuit comprising:

a plurality of paths between two terminals; and an impedance adjustment section provided in each of the paths, said impedance adjustment section having at least a switching element and an impedance element which are connected in series;

wherein synthesized impedances of ON resistance of the switch element and the impedance element of the paths are set so that the synthesized impedance have a predetermined relation.

According to other aspect of the present invention, there is provided an impedance adjusting circuit comprising:

a plurality (1st to n-th) of switch elements one ends thereof being connected to a first terminal;

a first resistance element connected between the other end of the first switch and a second terminal;

an n-th resistance element connected between the other ends of the n-th switch and (n-1)th switch;

wherein synthesized impedances of paths when corresponding switches are ON are set to have a predetermined proportional relation.

BRIEF DESCRIPTION OF THE DRAWINGS

In the attached drawings.

DESCRIPTION OF THE PREFERRED EMBODIMENTS

Embodiments of the present invention will now be explained with reference to attached drawings FIGS. 4–12.

Figure 4:
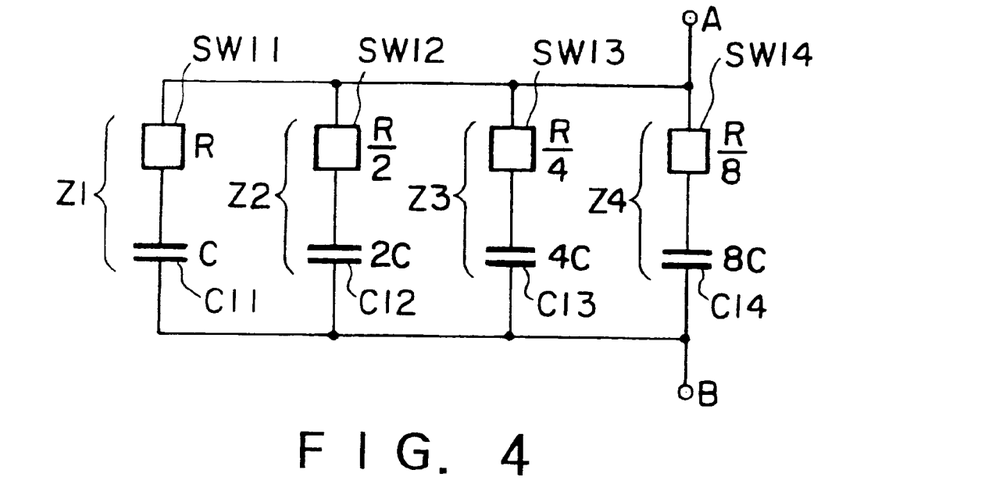
FIG. 4 is a circuit diagram showing a general construction of a first embodiment of the impedance adjusting circuit according to the present invention.

FIG. 4 is a circuit diagram showing a general construction of an impedance adjusting circuit according to the present invention. This circuit has four paths connected in parallel between terminals A and B. The first path is composed of a switch S11 having an ON resistance R and a capacitor C11 having a capacitance C, which are connected in series. The second path is composed of a switch SW12 having an ON-resistance W2 and a capacitor C12 having a capacitance 2C, which are connected in series. The third path is composed of a switch SW13 having an ON-resistance R/4 and a capacitor C12 having a capacitance 4C, which are connected in series. The fourth path is composed of a switch SW14 having an ON-resistance R/8 and a capacitor C14 having a capacitance 8C, which are connected in series. It is to be noted that in this embodiment, both ON-resistances and capacitances are in proportional relations and products of ON-resistance and capacitance are in the same value.

In this embodiment, the synthesized impedances of the paths are calculated as follows:

$$Z1 = R + 1/j\omega C = (j\omega RC+1)/j\omega C$$

$$Z2 = R/2 + 1/j\omega(2C) = (j\omega RC+1)/2j\omega C$$

$$Z3 = R/4 + 1/j\omega(4C) = (j\omega RC+1)/4j\omega C$$

$$Z4 = R/8 + 1/j\omega(8C) = (j\omega RC+1)/8j\omega C$$

If these relations are generalized, in n-th path, the following relation $$Zn = R/2^{(n-1)} + 1/j\omega(2^{(n-1)}C) = (j\omega RC+1)/2^{(n-1)}j\omega C$$

is obtained.

The impedance ratio among the paths is expressed as follows:

$$Z1:Z2: \ldots :Zn = 1/C:1/2C: \ldots :1/2^{(n-1)}C = 2^{(n-1)}: \ldots :2:1$$

Figure 5:
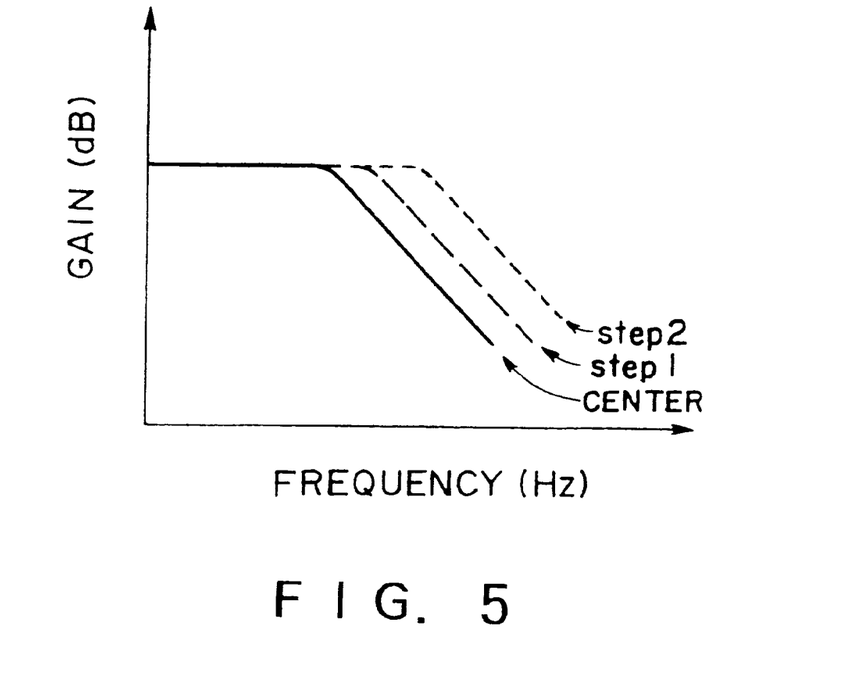
FIG. 5 is a graph showing adjustment of a filter using the circuit shown in FIG. 4.

Therefore, the impedance ratio becomes simple integer ratio excluding $j\omega$ component. As a result, as shown in FIG. 5, frequency can be changed without generating peak level variation around the cut-off frequency.

Figure 6:
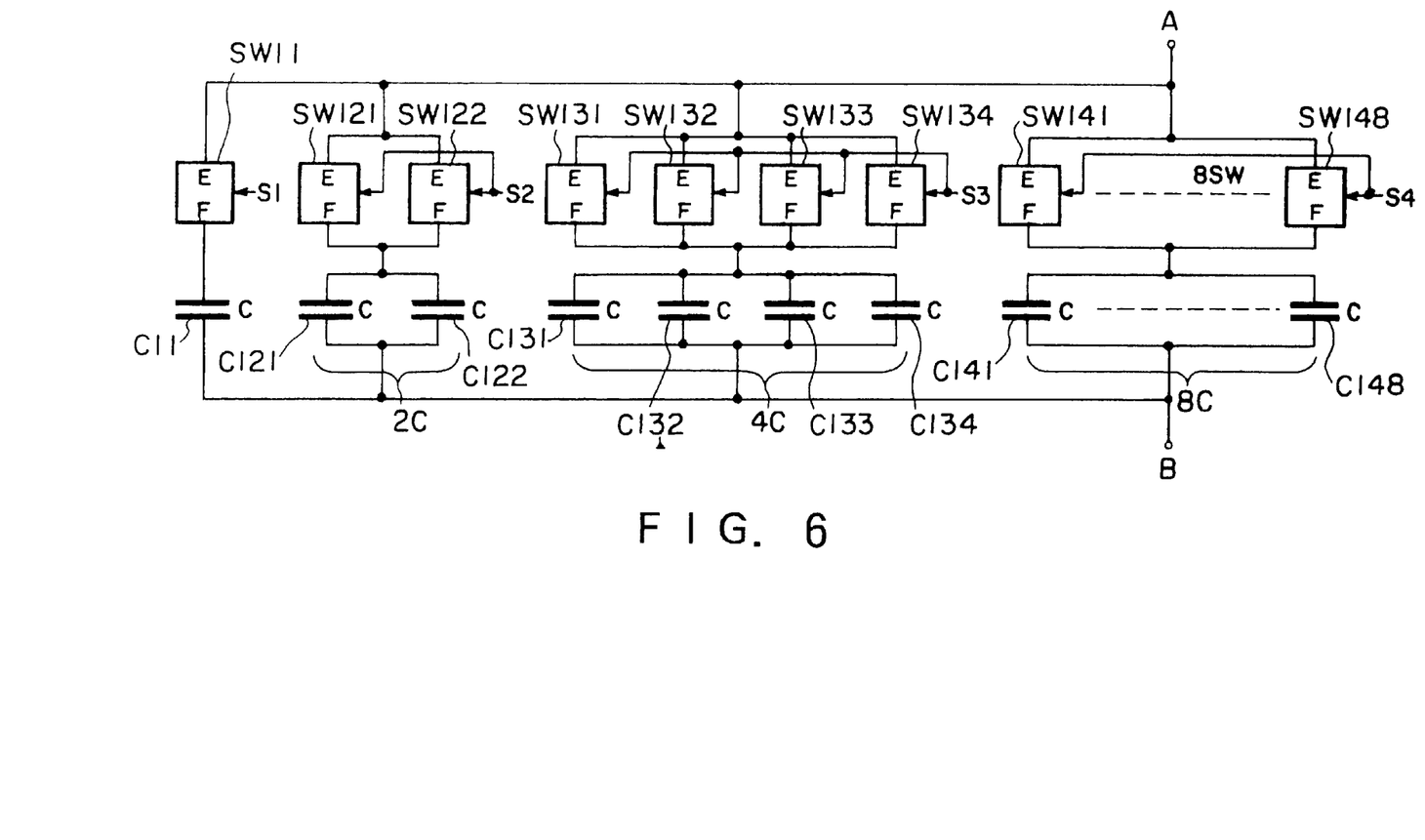
FIG. 6 is a circuit diagram showing a first practical embodiment of the first embodiment of the impedance adjusting circuit according to the present invention.

FIG. 6 is a circuit diagram showing a first practical embodiment of the circuit shown in FIG. 4.

According to this embodiment, there are provided four paths connected in parallel. In the first path, a switch SW11 having an ON resistance R controlled by a control signal S1 and a capacitor C11 having a capacitance C are connected in series between the terminals A and B. In the second path, two switches SW121 and SW122 each having ON resistance R which are connected in parallel and controlled by a control signal S2 and two capacitors C121 and C122 connected in parallel are connected in series. In the third path, four switches SW131–SW124 each having ON resistance R which are connected in parallel and controlled by a control signal S3 and four capacitors C131–C134 connected in parallel are connected in series. In the fourth path, eight switches SW141–SW148 each having ON resistance R which are connected in parallel and controlled by a control signal S3 and eight capacitors C141–C148 connected in parallel are connected in series.

Figure 7:
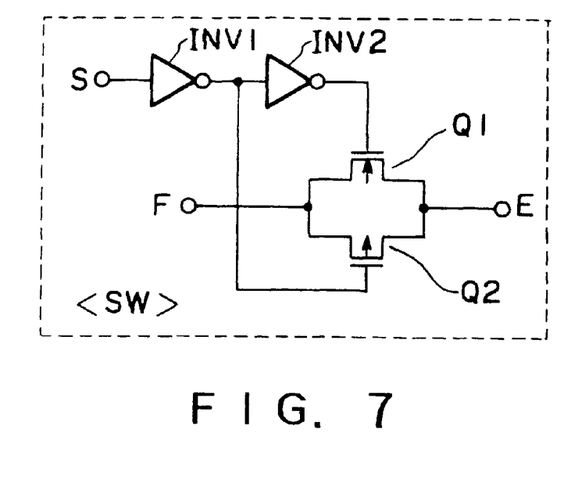
FIG. 7 is a circuit diagram showing a construction of a switch employed in the embodiment shown in FIG. 6.

FIG. 7 shows a construction of a switch used in the circuit in FIG. 6. An n channel MOS transistor Q1 and a p channel MOS transistor Q2 are connected in parallel between the terminals E and F. A signal from the control signal S twice inverted by inverters INV1 and INV2 is supplied to a gate terminal of the MOS transistor Q1, and an another signal from the control signal S inverted by the inverter INV1 is supplied to a gate terminal of the MOS transistor Q2. From these construction, two transistors Q1 and Q2 are controlled to open/close simultaneously.

Since the resistances and capacitances in this embodiment are the same as in the embodiment shown in FIG. 4, the same trimming characteristic as shown in FIG. 5 can be obtained.

It is to be noted that switches and capacitors can be formed by ordinary patterning, however, these elements can be obtained by interconnecting standard cells which are prepared to arrange standard unit cells in matrix form. Such method enables to obtain accurate integer ratio of impedances among paths.

Figure 8:
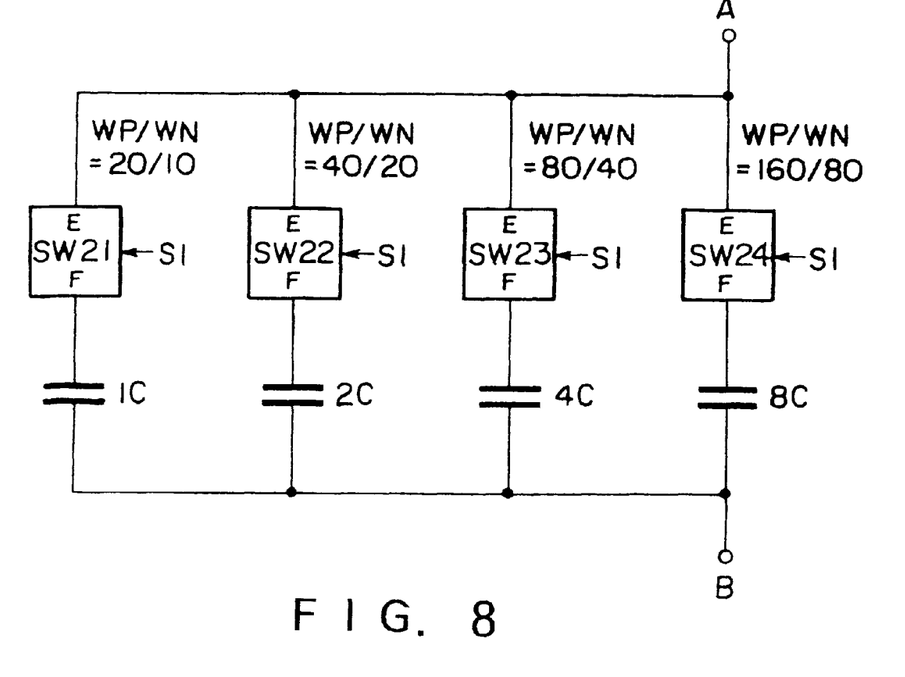
FIG. 8 is a circuit diagram showing a second practical embodiment of the first embodiment of the impedance adjusting circuit according to the present invention.

FIG. 8 is a circuit diagram showing a second practical embodiment of the circuit shown in FIG. 4 in which switches SW21–SW24 having different ON resistances are obtained by varying the size of the switches. The switch used in this embodiment is shown in FIG. 9.

Figure 9:
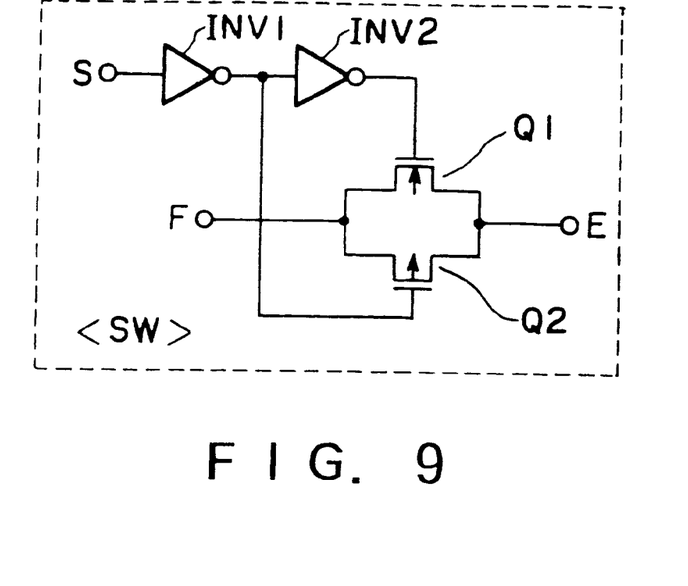
FIG. 9 is a circuit diagram showing a construction of a switch employed in the embodiment shown in FIG. 8.

The connection in FIG. 9 is the same as that in FIG. 7, but the size of transistors are specially designed. More specifically, an N channel transistor Q1 has a gate length L and gate width WN, and a P channel transistor Q2 has a gate length L and gate width WP. As shown in FIG. 9, in the switch SW21 of the first path, the ratio of WP to WN (WP/WN) is 20/10, and 40/20 for the switch SW22 of the second path, 80/40 for the switch SW23 of the third path, and 160/80 for the switch SW24 of the fourth path. Since the sizes of the transistors are different, the ON resistance of the transistors are the same as those in FIG. 4, and therefore the trimming characteristic shown in FIG. 5 is obtained.

Figure 10:
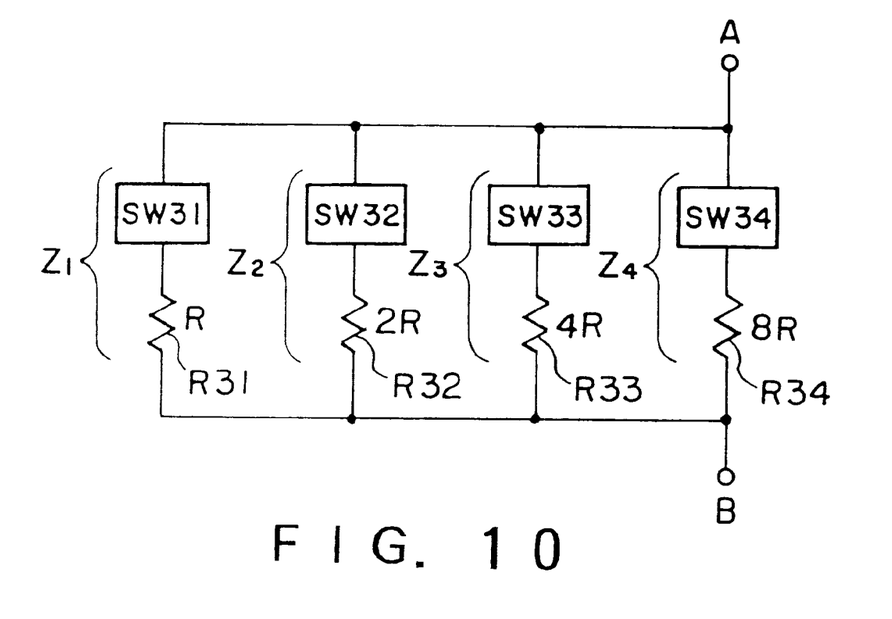
FIG. 10 is a circuit diagram showing a general construction of a second embodiment of the impedance adjusting circuit according to the present invention.

FIG. 10 is a circuit diagram showing a fourth embodiment of the present invention, in which resistors are used as impedance elements.

In this embodiment, there are four paths connected in parallel between the terminals A and B, each path having series connected a switch and a resistor. In the first path, a switch SW31 having ON resistance of 1/8 R' and a resistor R31 having a resistance R are connected in series. In the same manner, there are provided a switch SW32 of 1/4 R' and a resistor R32 of 2R in the second path, a switch SW33 of 1/2 R' and a resistor R33 of 4R in the third path, and a switch SW34 of R' and a resistor R34 of 8R.

Synthesized impedance of each path is calculated as follows:

$$Z1 = R + R'/8$$

$$Z2 = 2R + R'/4 = 2Z1$$

$$Z3 = 4R + R'/2 = 4Z1$$

$$Z4 = 8R + R' = 8Z1$$

Therefore, the impedance ratio among the four paths becomes simple and very accurate integer ratio of 1:2:4:8.

This is different from the conventional impedance adjusting circuit in which ON resistance of the switches of every path are the same and accordingly impedance ratio does not become simple integer ratio. It introduces an inaccuracy for filter characteristic and A/D, D/A conversion, etc.

In this embodiment, the switches having various resistance can be obtained by the same construction as shown in FIG. 6 or 8.

Figure 11:
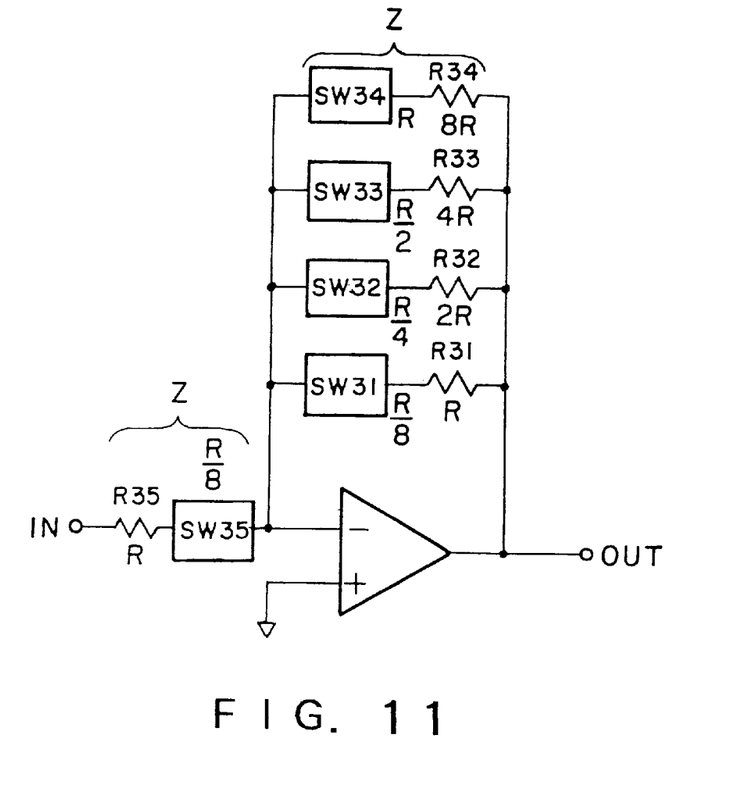
FIG. 11 is a circuit diagram explaining gain adjustment of a variable gain amplifier when the impedance adjusting circuit of FIG. 10 is applied to an inverting amplifier.

FIG. 11 shows an application of the impedance adjusting circuit shown in FIG. 10 to a variable amplitude inverting amplifier. The impedance adjusting circuit is connected between an output terminal and a reverse terminal of an operational amplifier. It is to be noted that there is provided the a dummy switch SW35 and a resistor R35 connected in series, which are the same construction of the impedance adjusting section in the first path, between an input terminal IN of this application circuit and the reverse input terminal of the operational amplifier.

In this example, the ON resistance R' of the switch is selected as same as the reference resistance R of the resistor. Therefore, the synthesized impedance of the paths 1–4 are obtained as 9R/8, 9R/4, 9R/2 and 9R by turning on the switches SW1–SW4, in turn. This means the ratio of amplitude of this variable amplitude amplifier is 8.

Figure 12:
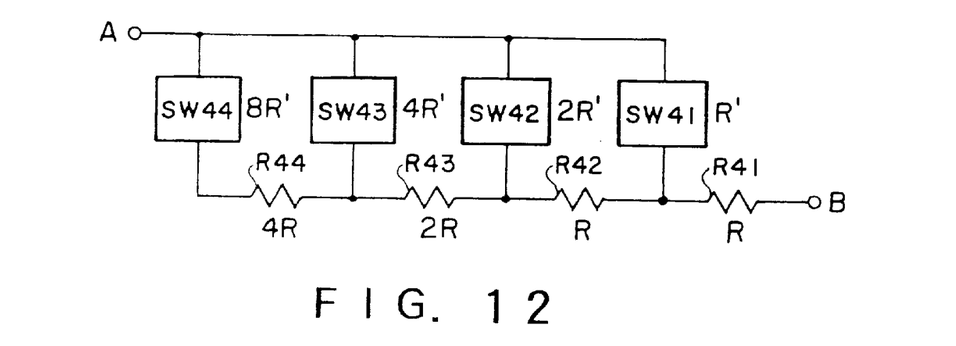
FIG. 12 is a circuit diagram showing a third embodiment of the impedance adjusting circuit according to the present invention.

FIG. 12 is a circuit diagram showing a fifth embodiment of the impedance adjusting circuit according to the present invention.

In this embodiment, resistors are employed as impedance elements as in the embodiment shown in FIG. 10 but connection thereof is different from the embodiment of FIG. 10. The switches SW1–SW4 have ON resistance of R', 2R', 4R' and 8R', respectively and one terminal of these switches are commonly connected to the terminal A. Other terminal of the SW1 is connected to the terminal B though a resistor having resistance R. A resistor having resistance of R is connected between other terminals of the switches SW1 and SW2, and in the same manner, a resistor having resistance 2R is connected between other terminals of the switches of SW2 and SW3, and a resistor having resistance 4R is connected between other terminals of the switches of SW3 and SW4. Such type of connection is generally called as ladder type connection.

By selectively turning on the switches SW1–SW4 in turn, the resistance between terminals A and B becomes as follows;

$$SW1\ ON\ Z1=R+R'$$

$$SW2\ ON\ Z2=R+R+2R'=2(R+R')$$

$$SW3\ ON\ Z3=R+R+2R+4R'=4(R+R')$$

$$SW4\ ON\ Z4=R+R+2R+4R+8R'=8(R+R')$$

Therefore, according to this embodiment, impedance ratio among the paths becomes simple integer ratio, such as 1:2:4:8.

In these three embodiments describe above, capacitors and resistors are employed as impedance elements, however, various impedance elements, for example, inductance elements are also applicable.

Furthermore, in the above-described embodiments, the relation of the synthesized impedances are in a relation of power function, however, such relation can be arbitrary selected considering the value adjusted or adjustment range. For example, if more precise adjustment is needed, the values of the elements are preferably set to one tenth of the values shown in the embodiments.

Still further, in order to obtain different resistances, dose in ion implantation can be changed.

As described above, according to the impedance adjustment circuit of the present invention, ON resistance of the switch is changed in response to the value of the impedance element in order to make the synthesized impedances of a plurality of paths, accurate trimming is possible when the impedance adjustment circuit is applied to an active filter, etc. without generating variation of peak level in frequency characteristic.

What is claimed is:

1. A trimming circuit comprising:

a plurality of branch paths between two terminals; and a trimming section provided in each of the branch paths, including at least a series circuit of an impedance element and a switching element, wherein the trimming section in a first branch path includes a first impedance element with an impedance Z and a first switching element with an ON resistance R, and the trimming section in an $N^{th}$ branch path includes:

an impedance element having an impedance of $\frac{1}{2}^{N-1}$ times Z; and a switching element having a unit ON resistance of $\frac{1}{2}^{N-1}$ times R.

2. The trimming circuit according to claim 1, wherein said switching element in the $N^{th}$ branch path comprises $2^{N-1}$ components of switching elements connected in parallel, each component having a unit ON resistance.

3. The trimming circuit according to claim 1, wherein said impedance element in $N^{th}$ branch path comprises $2^{N-1}$ components of capacitance elements connected in parallel, each component having a unit capacitance.

4. The trimming circuit according to claim 1, wherein said impedance element in $N^{th}$ branch path comprises $2^{N-1}$ components of resistance elements connected in parallel, each component having a unit resistance.

5. The trimming circuit according to claim 1, wherein said switching elements comprise:

a pair of transistors having $2^{N-1}$ times gate widths of reference transistors.

6. The trimming circuit according to claim 1, wherein in the $N^{th}$ branch path includes:

the switching element is composed of transistors of a same size connected in parallel and the impedance element is composed of unit capacitance elements of a same size connected in parallel.

7. The trimming circuit according to claim 6, wherein said transistors and said capacitance elements are formed by utilizing standard cells.

* * * * *